United States Patent
Kawamoto et al.

(10) Patent No.: US 10,520,555 B2
(45) Date of Patent: Dec. 31, 2019

(54) BATTERY MONITORING APPARATUS

(71) Applicant: DENSO CORPORATION, Kariya, Aichi-pref. (JP)

(72) Inventors: Shinsuke Kawamoto, Kariya (JP); Yasuhito Tanabe, Kariya (JP)

(73) Assignee: DENSO CORPORATION, Kariya (JP)

( * ) Notice: Subject to any disclaimer, the term of this patent is extended or adjusted under 35 U.S.C. 154(b) by 171 days.

(21) Appl. No.: 15/671,550

(22) Filed: Aug. 8, 2017

(65) Prior Publication Data
US 2018/0045789 A1   Feb. 15, 2018

(30) Foreign Application Priority Data

Aug. 9, 2016 (JP) .................. 2016-156883

(51) Int. Cl.
| | |
|---|---|
| *G01R 31/396* | (2019.01) |
| *G01R 31/382* | (2019.01) |
| *G01K 7/22* | (2006.01) |
| *G01R 31/00* | (2006.01) |
| *H01M 10/42* | (2006.01) |
| *H01M 10/48* | (2006.01) |
| *G01R 31/02* | (2006.01) |

(52) U.S. Cl.
CPC ............ *G01R 31/396* (2019.01); *G01K 7/22* (2013.01); *G01R 31/006* (2013.01); *G01R 31/382* (2019.01); *H01M 10/4257* (2013.01); *H01M 10/486* (2013.01); *G01K 2215/00* (2013.01); *G01R 31/025* (2013.01)

(58) Field of Classification Search
CPC .. G01R 31/396; G01R 31/382; G01R 31/006; G01R 31/025; G01K 7/24; G01K 15/007; G01K 7/22; G01K 2205/00; G01K 2215/00; H01M 10/486; H01M 10/4257
USPC .......................................... 324/434; 320/118
See application file for complete search history.

(56) References Cited

U.S. PATENT DOCUMENTS

2011/0025271 A1* 2/2011 Yamamoto .......... H01M 10/441
                                                                    320/118
2016/0380317 A1* 12/2016 Lin ..................... H01M 10/482
                                                                    429/90

FOREIGN PATENT DOCUMENTS

JP          2005-224071 A       8/2005

* cited by examiner

*Primary Examiner* — Farhana A Hoque
(74) *Attorney, Agent, or Firm* — Oliff PLC

(57) ABSTRACT

A battery monitoring apparatus that monitors a temperature of a battery includes a temperature detecting unit, a power supply, a limiting unit, a temperature acquiring unit, and determining unit. The temperature detecting unit is provided for the battery. Resistance of the temperature detecting unit changes with temperature. The power supply applies a voltage to the temperature detecting unit. The limiting unit limits the application of voltage to the temperature detecting unit from the power supply. When the limiting unit is not limiting the application of voltage, the temperature acquiring unit determines the temperature of the battery based on a voltage-drop amount in the temperature detecting unit. When the limiting unit is limiting the application of voltage, the determining unit makes a determination regarding a short circuit between the temperature detecting unit and the battery based on the voltage applied to the temperature detecting unit.

14 Claims, 5 Drawing Sheets

BATTERY MONITORING APPARATUS

CROSS-REFERENCE TO RELATED APPLICATION

This application is based on and claims the benefit of priority from Japanese Patent Application No. 2016-156883, filed Aug. 9, 2016. The entire disclosure of the above application is incorporated herein by reference.

BACKGROUND

Technical Field

The present invention relates to a battery monitoring apparatus that monitors a temperature of a battery.

Related Art

For example, a technology in which a battery configured by a plurality of single cells is used as a power supply in an automobile or the like is known. In a battery such as this, when a temperature of a single cell becomes equal to or higher than a predetermined temperature, problems such as reduction of life occur. Therefore, the temperatures of the single cells are required to be detected to prevent these problems. For this reason, for example, a thermistor is attached to each single cell. A resistance value of the thermistor changes based on the temperature. Thus, the temperature of each single cell is detected by the thermistor (refer to, for example, JP-A-2005-224071).

Specifically, taking advantage of the fact that the power supply voltage is already known, the resistance value of the thermistor is calculated and the calculated resistance value is converted to temperature. The temperature of each single cell is thereby determined.

When the temperature of the battery is detected by the thermistors as in the battery monitoring apparatus described in JP-A-2005-224071, because advantage is taken of the fact that the power supply voltage is already known, a normal temperature may not be calculated in cases in which a short circuit occurs between any of the thermistors and the battery, and a voltage applied to the thermistor changes.

SUMMARY

It is thus desired to provide a battery monitoring apparatus that is capable of making an appropriate determination regarding a short circuit between a temperature detecting unit and a battery, when the temperature detecting unit of which resistance changes with temperature is used.

An exemplary embodiment provides a battery monitoring apparatus that monitors a temperature of a battery includes: a temperature detecting unit that is provided for the battery and of which resistance changes with temperature; a power supply that applies a voltage to the temperature detecting unit; a limiting unit that limits the application of voltage to the temperature detecting unit from the power supply; a temperature acquiring unit that determines the temperature of the battery based on a voltage-drop amount in the temperature detecting unit when the limiting unit is not limiting the application of voltage; and a determining unit that makes a determination regarding a short circuit between the temperature detecting unit and the battery based on the voltage applied to the temperature detecting unit when the limiting unit is limiting the application of voltage.

When the temperature of a battery is to be detected using a temperature detecting unit of which the resistance changes with the temperature, a voltage is applied to the temperature detecting unit from a power supply. The resistance of the temperature detecting unit is determined based on a voltage-drop amount in the temperature detecting unit. The temperature is then determined from the value of the resistance. When an attempt to detect a short circuit between the temperature detecting unit and the battery is made at this time, in cases in which the voltage of the battery is lower than the voltage of the power supply, even should a short circuit occur between the temperature detecting unit and the battery, the detected voltage is lower than the voltage of the battery. A determination may be made that a normal temperature is detected.

In this regard, in the above-described configuration, the determination regarding a short circuit is made based on the voltage applied to the temperature detecting unit when the limiting unit is limiting the application of voltage to the temperature detecting unit from the power supply. Therefore, a voltage that is higher than the limited voltage is applied to the temperature detecting unit in the event of a short circuit. Consequently, a short circuit between the battery and the temperature detecting unit can be accurately detected as a result of the determination regarding a short circuit being made based on the voltage applied to the temperature detecting unit when the limiting unit is limiting the application of voltage to the temperature detecting unit from the power supply.

DESCRIPTION OF THE EMBODIMENTS

Figure 1:
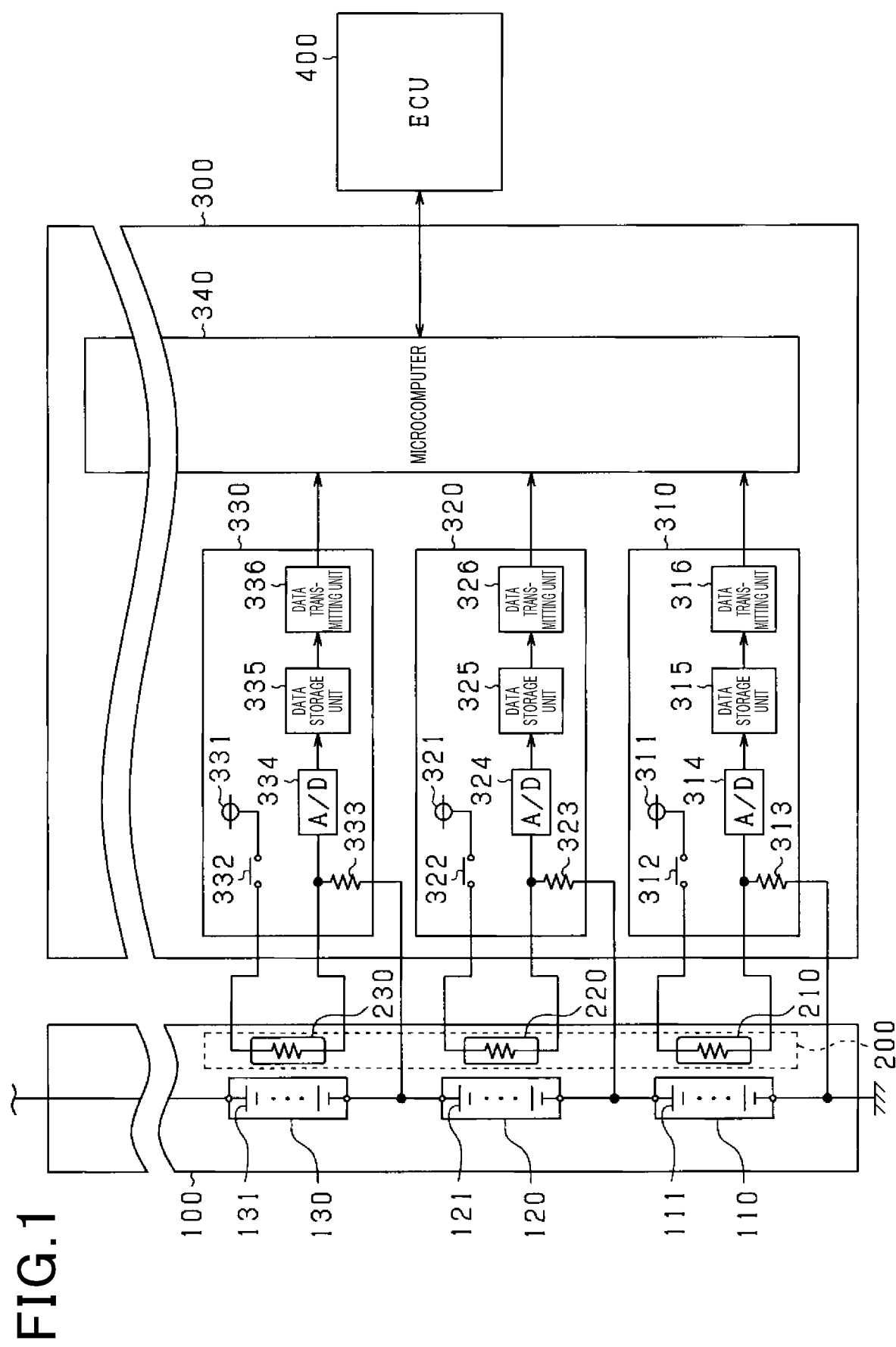
FIG. 1 is a diagram of a configuration of a battery monitoring apparatus according to a first embodiment.

Each embodiment will hereinafter be described with reference to the drawings. Sections that are identical or equivalent to each other among the following embodiments are given the same reference numbers in the drawings. Descriptions of sections having the same reference numbers are applicable therebetween.

<First Embodiment>

A battery monitoring apparatus according to the present embodiment is mounted in a hybrid car. The hybrid car is provided with a lithium-ion storage battery and a lead storage battery. The lithium-ion storage battery is configured by a plurality of cells and has an open circuit voltage of several hundred volts. The lead storage battery has an open circuit voltage of about 12 volts. The battery monitoring apparatus monitors a temperature of the lithium-ion storage battery.

A configuration of the battery monitoring apparatus according to the present embodiment will be described with reference to FIG. 1. The battery monitoring apparatus detects a temperature, a voltage, and the like of a battery 100. The battery 100 is the lithium-ion storage battery. The battery 100 is configured by a plurality of stacks 110, 120, and 130 that are connected in series. The stacks 110, 120, and 130 are respectively configured by a plurality of battery cells 111, 121, and 131 that are respectively connected in series. The battery cells 111, 121, and 131 can also be referred to as single cells. For example, an open circuit voltage of each of the battery cells 111, 121, and 131 is 2.4 volts. The stacks 110, 120, and 130 respectively include a plurality of battery cells 111, 121, and 131. Therefore, an open circuit voltage of each of the stacks 110, 120, and 130 is, for example, several tens of volts.

The battery monitoring apparatus that monitors the temperature of the battery 100 is configured to include a thermistor group 200 and a battery control electronic control unit (ECU) 300. The thermistor group 200 is provided in the battery 100. The thermistor group 200 is configured to include a plurality of thermistors 210, 220, and 230. Each of the thermistors 210, 220, and 230 is configured by a material of which resistance decreases in accompaniment with increase in temperature. The thermistors 210, 220, and 230 function as temperature detecting units. Each of the thermistors 210, 220, and 230 is provided such as to be in contact with a side surface or a top surface of a casing of the corresponding stack 110, 120, or 130.

Monitoring circuits 310, 320, and 330 are respectively connected to the thermistors 210, 220, and 230. Each of the monitoring circuits 310, 320, and 330 acquires a voltage based on a voltage-drop amount in the corresponding thermistor 210, 220, or 230, and outputs the voltage as a digital value. The monitoring circuits 310, 320, and 330 are mounted on a common substrate. A microcomputer 340 is also mounted on the substrate. The microcomputer 340 includes at least a central processing unit (CPU), a read-only memory (ROM), and a random access memory (RAM). The battery control ECU 300 is configured by the monitoring circuits 310, 320, and 330, and the microcomputer 340.

The monitoring circuits 310, 320, and 330 respectively include constant-voltage power supplies 311, 321, and 331 and pull-down resistors 313, 323, and 333. The constant-voltage power supplies 311, 321, and 331 are respectively connected to first ends of the thermistors 210, 220, and 230 by switches 312, 322, and 332. The pull-down resistors 313, 323, and 333 are respectively connected to second ends of the thermistors 210, 220, and 230. The side of each of the pull down resistors 313, 323, and 333 opposite the side connected to the corresponding thermistor 210, 220, or 230 is connected to a low-potential side of the corresponding stack 110, 120, or 130 of which the temperature is to be detected, as a reference potential point. Each of the constant-voltage power supplies 311, 321, and 331 is a power supply that outputs a constant voltage that is prescribed in advance. For example, the constant voltage is set such that a potential difference from the reference potential point is 5 volts. In an open state, the switches 312, 322, and 332 respectively function as limiting units that limit the application of voltages from the constant-voltage power supplies 311, 321, and 331 to the thermistors 210, 220, and 230.

The monitoring circuits 310, 320, and 330 respectively include analog-to-digital (A/D) converting units 314, 324, and 334. The A/D converting units 314, 324, and 334 respectively convert the voltages between the thermistors 210, 220, and 230 and the pull-down resistors 313, 323, and 333 to digital values. In each of the A/D converting units 314, 324, and 334, a lower limit value of input and output values is set to the voltage of the reference potential point and an upper limit value of the input and output values is set to the voltage of the corresponding constant-voltage power supply 311, 321, or 331, to improve resolution of the outputted digital value.

Voltage data, which is the respective digital values indicating the voltages between the thermistors 210, 220, and 230 and the pull-down resistors 313, 323, and 333, is outputted from the A/D converting units 314, 324, and 334 and inputted to data storage units 315, 325, and 335. The data storage units 315, 325, and 335 temporarily store therein the voltage data acquired from the A/D converting units 314, 324, and 334. The voltage data temporarily stored in the data storage units 315, 325, and 335 is transmitted to the microcomputer 340 from data transmitting units 316, 326, and 336.

The microcomputer 340 calculates the temperature of the battery 100 and makes a determination regarding a short circuit between the battery 100 and any of the thermistors 210, 220, and 230, based on the voltage data acquired from the data transmitting units 316, 326, and 336. For example, a short circuit between the battery 100 and the thermistors 210, 220, and 230 may occur when an electrolytic solution leaks from the battery 100, or when damage caused by deterioration and the like occurs. The microcomputer 340 functions as a temperature acquiring unit when the temperature of the battery 100 is to be determined. The microcomputer 340 functions as a determining unit when the determination regarding a short circuit is to be made. For example, the microcomputer 340 stores therein (e.g., in the ROM) a predetermined program that enables the microcomputer 340 to function as the temperature acquiring unit and the determining unit.

The microcomputer 340 is communicably connected to a higher order ECU 400. The ECU 400 limits discharge from the battery 100 and charging of the battery 100 when, for example, the temperature of the battery 100 acquired from the microcomputer 340 is higher than a predetermined value, and overheating is occurring. In addition, the ECU 400 performs a process to limit use, in various types of control, of a temperature acquired from any of the thermistors 210, 220, and 230 in which a short circuit to the battery 100 has occurred.

The battery monitoring apparatus is also provided with voltage sensors. The voltage sensors respectively detect the voltages of the stacks 110, 120, and 130. The battery monitoring apparatus acquires a charging amount of the battery 100 and the like based on the voltages detected by the voltage sensors. The ECU 400 performs charge/discharge control based on the charging amount of the battery 100 and the like. These controls are known controls. Therefore, a detailed description thereof is omitted.

Battery monitoring control performed by the battery monitoring apparatus, configured as described above, will be described.

When the temperatures of the stacks 110, 120, and 130 are to be detected, the switches 321, 322, and 332 are set to a connected state. The constant voltages are applied to the thermistors 210, 220, and 230 from the constant-voltage power supplies 311, 323, and 331. At this time, the voltage data inputted to the microcomputer 340 is that in which the voltage-drop amounts in the thermistors 210, 220, and 230 are respectively subtracted from the voltages of the constant-voltage power supplies 311, 321, and 331. Therefore, the microcomputer 340 determines the resistance values of the thermistors 210, 220, and 230 using the voltage values of the constant-voltage power supplies 311, 321, and 331, the inputted voltage data, and the resistance values of the pull-down resistors 313, 323, and 333. When the resistance values of the thermistors 210, 220, and 230 are determined, the microcomputer 340 determines the temperatures of the thermistors 210, 220, and 230 based on these resistance values.

When a short circuit between the battery 100 and any of the thermistors 210, 220, and 230 is to be detected, the switches 312, 322, and 332 are set to a disconnected state. When the switches 312, 322, and 332 are in the disconnected state, the voltages from the constant-voltage power supplies 311, 321, and 331 are not applied to the thermistors 210, 220, and 230 and the pull-down resistors 313, 323, and 333.

Thus, when a short circuit has not occurred between any of the stacks 110, 120, and 130 and thermistors 210, 220, and 230, the voltage values inputted to the microcomputer 340 via the A/D converting units 314, 324, and 334 are zero. Meanwhile, when a short circuit has occurred between the battery 100 and any of the thermistors 210, 220, and 230, the voltage of the battery 100 is applied to the thermistor 210, 220, or 230 and the corresponding pull-down resistor 313, 323, or 333.

Therefore, the voltage data inputted to the microcomputer 340 is no longer zero. In the microcomputer 340, when the voltage data that is inputted when the switches 312, 322, and 332 are in the disconnected state is greater than a predetermined threshold, a determination is made that a short circuit has occurred between the battery 100 and the thermistor 210, 220, or 230.

According to the present embodiment, the switches 312, 322, and 332 are used to reduce (to zero) the voltages applied from the constant-voltage power supplies 311, 321, and 331 to the thermistors 210, 220, and 230 and the pull-down resistors 313, 323, and 333. However, the switches 312, 322, and 332 may not be provided. Voltages may be applied from variable voltage sources instead of the constant voltage power supplies 311, 321, and 331. As a result, when the temperature of the battery 100 is to be detected, a voltage of each variable voltage source on a high-voltage side (such as a value at which the potential difference from the reference potential point is 5 volts) may be applied. When a short circuit is to be detected, a voltage of each variable voltage source on a low-voltage side (such as a value at which the potential difference from the reference potential point is 0.5 volts) may be applied.

As a result of the above-described configuration, the battery monitoring apparatus according to the present embodiment achieves the following effects.

When the temperature of the battery 100 is to be detected using the thermistors 210, 220, and 230, the voltages from the constant-voltage power supplies 311, 321, and 331 are applied to the thermistors 210, 220, and 230. The resistances of the thermistors 210, 220, and 230 are determined based on the voltage-drop amounts in the thermistors 210, 220, and 230. The temperature is then determined from the resistance values. When an attempt to detect a short circuit between the thermistors 210, 220, and 230 and the battery 100 is made at this time, in cases in which the voltage of the battery 100 is lower than the voltages of the constant-voltage power supplies 311, 321, and 331, even should a short circuit occur between any of the thermistors 210, 220, and 230 and the battery 100, the detected voltage is lower than the voltages of the constant-voltage power supplies 311, 321, and 331. A determination may be made that a normal temperature is detected.

In this regard, according to the present embodiment, the determination regarding a short circuit is made based on the voltages applied to the thermistors 210, 220, and 230, when the application of the voltages from the constant-voltage power supplies 311, 321, and 331 to the thermistors 210, 220, and 230 is interrupted by the switches 312, 322, and 332. Therefore, a short circuit between the battery 100 and the thermistors 210, 220, and 230 can be accurately detected.

In the determination regarding a short circuit between the battery 100 and the thermistors 210, 220, and 230, when the determination regarding the short circuit is to be made based on the voltages between the constant-voltage power supplies 311, 321, and 332 and the thermistors 210, 220, and 230, a determination regarding a short circuit to the battery 100 between the constant-voltage power supplies 311, 321, and 331 and the thermistors 210, 220, and 230 can be made. However, a determination regarding a short circuit to the battery 100 cannot be made in cases in which the short circuit has occurred between the thermistors 210, 220, and 230 and the reference potential points.

In this regard, according to the present embodiment, the determination regarding a short circuit is made based on the voltages between the thermistors 210, 220, and 230 and the reference potential points. Therefore, even should a short circuit between any of the thermistors 210, 220, and 230 and the battery 100 occur between either of the constant-voltage power supplies 311, 321, 331 and the thermistors 210, 220, and 230, and the thermistors 210, 220, and 230 and the reference potential points, the determination regarding the short circuit can be made.

The thermistors 210, 220, and 230 are connected to the reference potential points via the pull-down resistors 313, 323, and 333. The voltages between the thermistors 210, 220, and 230 and the pull down resistors 313, 323, and 333 are detected. Therefore, currents inputted to the A/D converting units 314, 324, and 334 can be suppressed.

<Second Embodiment>

Figure 2:
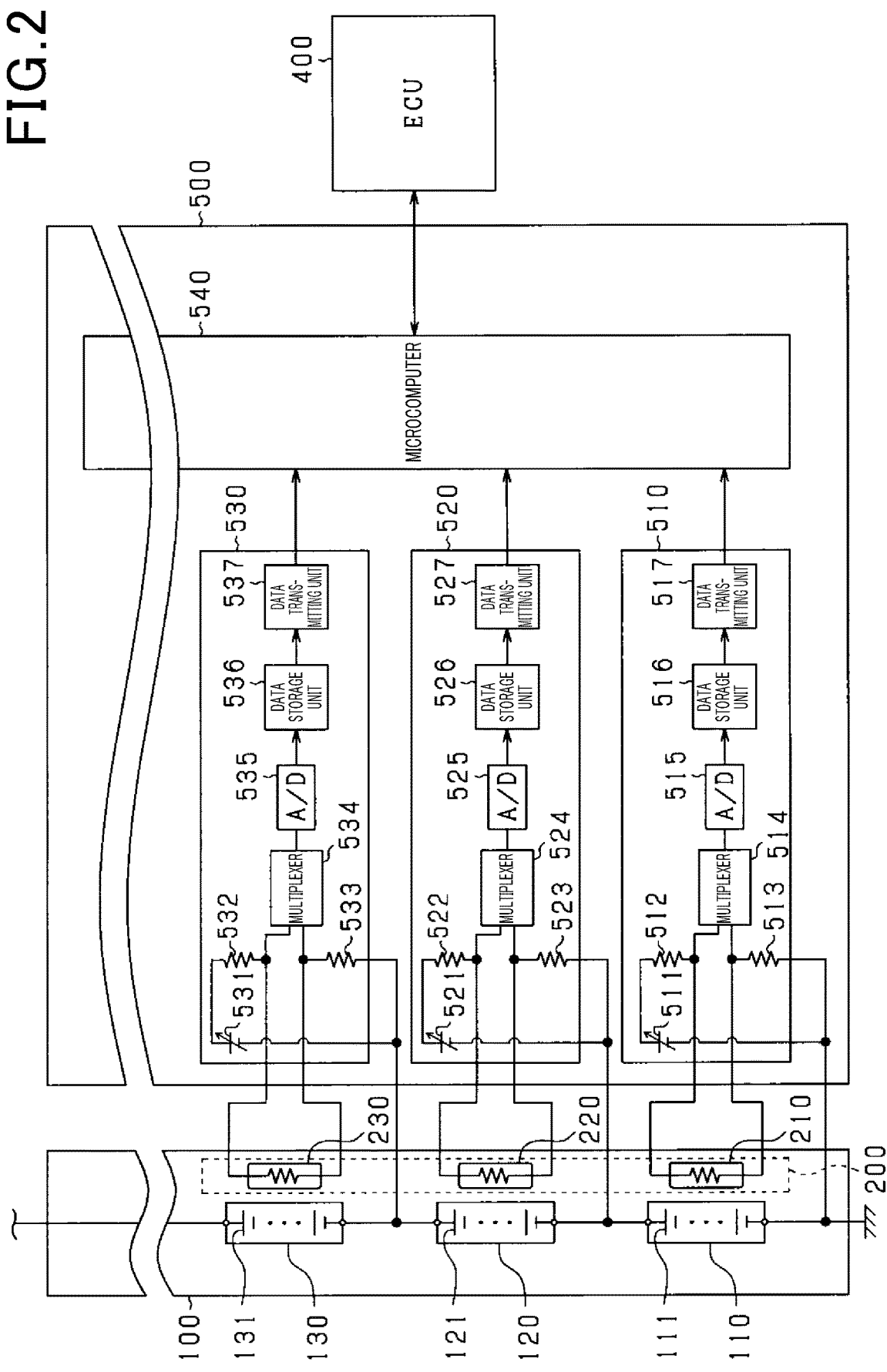
FIG. 2 is a diagram of a configuration of a battery monitoring apparatus according to a second embodiment.

According to the present embodiment, a part of the configuration of the battery monitoring apparatus differs from that according to the first embodiment. The battery monitoring apparatus according to the present embodiment will be described with reference to FIG. 2.

A battery control ECU 500 according to the present embodiment includes monitoring circuits 510, 520 and 530, and a microcomputer 540. The monitoring circuits 510, 520, and 530, and the microcomputer 540 are mounted on a common substrate.

In the monitoring circuits 510, 520, and 530, variable voltage sources 511, 521, and 531 are respectively connected to first sides of the thermistors 210, 220, and 230, via pull-up resistors 512, 522, and 532. The variable voltage sources 511, 521, and 531 are capable of changing voltages between a high-voltage side (such as 5 volts) and a low-voltage side (such as 0.5 volts).

As a result of the voltages of the variable voltage sources 511, 521, and 531 being set to the low-voltage side, the variable voltage sources 511, 521, and 531 themselves can be considered to function as limiting units. Second sides of the thermistors 210, 220, and 230 are connected to reference potential points, via pull-down resistors 513, 523, and 533. The reference potential points are low-potential sides of the stacks 110, 120, and 130 that are targets detected by the thermistors 210, 220, and 230.

Input sides of multiplexers 514, 524, and 534 are respectively connected between the thermistors 210, 220, and 230 and the pull-up resistors 512, 522, and 532, and between the thermistors 210, 220, and 230 and the pull-down resistors 513, 523, and 533. Output sides of the multiplexers 514, 524, and 534 are respectively connected to A/D converting units 515, 525, and 535 that convert voltage values to digital values.

Voltage data, which is the output values of the A/D converting units 515, 525, and 535, is inputted to data storage units 516, 526, and 536. The data storage units 516, 526, and 536 temporarily store therein the voltage data acquired from the A/D converting units 515, 525, and 535. The voltage data temporarily stored in the data storage units 516, 526, and 536 are transmitted to the microcomputer 540 via data transmitting units 517, 527, and 537.

Battery monitoring control performed by the battery monitoring apparatus, configured as described above, will be described.

When the temperatures of the stacks 110, 120, and 130 are to be detected, the voltages of the variable voltage sources 511, 521, and 531 are set to the high-voltage side (such as 5 volts). In the multiplexers 514, 524, and 534, respective first voltages and second voltages are inputted to the microcomputer 540, via the A/D converting units 515, 525, and 535, the data storage units 516, 526, and 536, and the data transmitting units 517, 527, and 537.

The first voltages are the voltages between the thermistors 210, 220, and 230 and the pull-up resistors 512, 522, and 532. The second voltages are the voltages between the thermistors 210, 220, and 230 and the pull-down resistors 513, 523, and 533. The microcomputer 540 determines differences between the inputted first voltages and second voltages, and determines the resistance values of the thermistors 210, 220, and 230 based on the differences.

When a short circuit between the thermistors 210, 220, and 230 and the stacks 110, 120, and 130 is to be detected, the voltages of the variable voltage sources 511, 521, and 531 are set to the low-voltage side (such as 0.5 volts). In the multiplexers 514, 524, and 534, the respective first voltages and second voltages are inputted to the microcomputer 540 via the A/D converting units 515, 525, and 535, the data storage unit 516, 526, and 536, and the data transmitting unit 517, 527, and 537.

The microcomputer 540 compares the inputted first voltages and second voltages to the voltages of the variable voltage sources 511, 521, and 531. When at least either of the first voltage and the second voltage is higher than the voltage of the variable voltage source 511, 521, or 531, the microcomputer 540 determines that a short circuit has occurred. The microcomputer 540 further compares the first voltage and the second voltage. When the first voltage is higher than the second voltage, the microcomputer 540 determines that a short circuit has occurred on the variable voltage source 511, 521, or 531 side of the thermistor 210, 220, or 230. Meanwhile, when the second voltage is higher than the first voltage, the microcomputer 540 determines that a short circuit has occurred on the reference potential point side of the thermistor 210, 220, or 230.

As a result of the above-described configuration, the battery monitoring apparatus according to the present embodiment achieves the following effect in addition to the effects achieved by the battery monitoring apparatus according to the first embodiment.

According to the present embodiment, when a short circuit between the battery 100 and any of the thermistors 210, 220, and 230 is to be detected, the first voltages and the second voltages are detected. The first voltages are the voltages between the thermistors 210, 220, and 230 and the pull-up resistors 512, 522, and 532. The second voltages are the voltages between the thermistors 210, 220, and 230, and the pull-down resistors 513, 523, and 533. The first voltages and the second voltages are compared. As a result, in addition to a determination regarding which of the thermistors 210, 220, and 230 is short-circuited to the battery 100, a determination regarding whether the short circuit has occurred on the power supply side or the reference potential point side of the thermistor 210, 220, or 230 can also be made.

<Third Embodiment>

Figure 3:
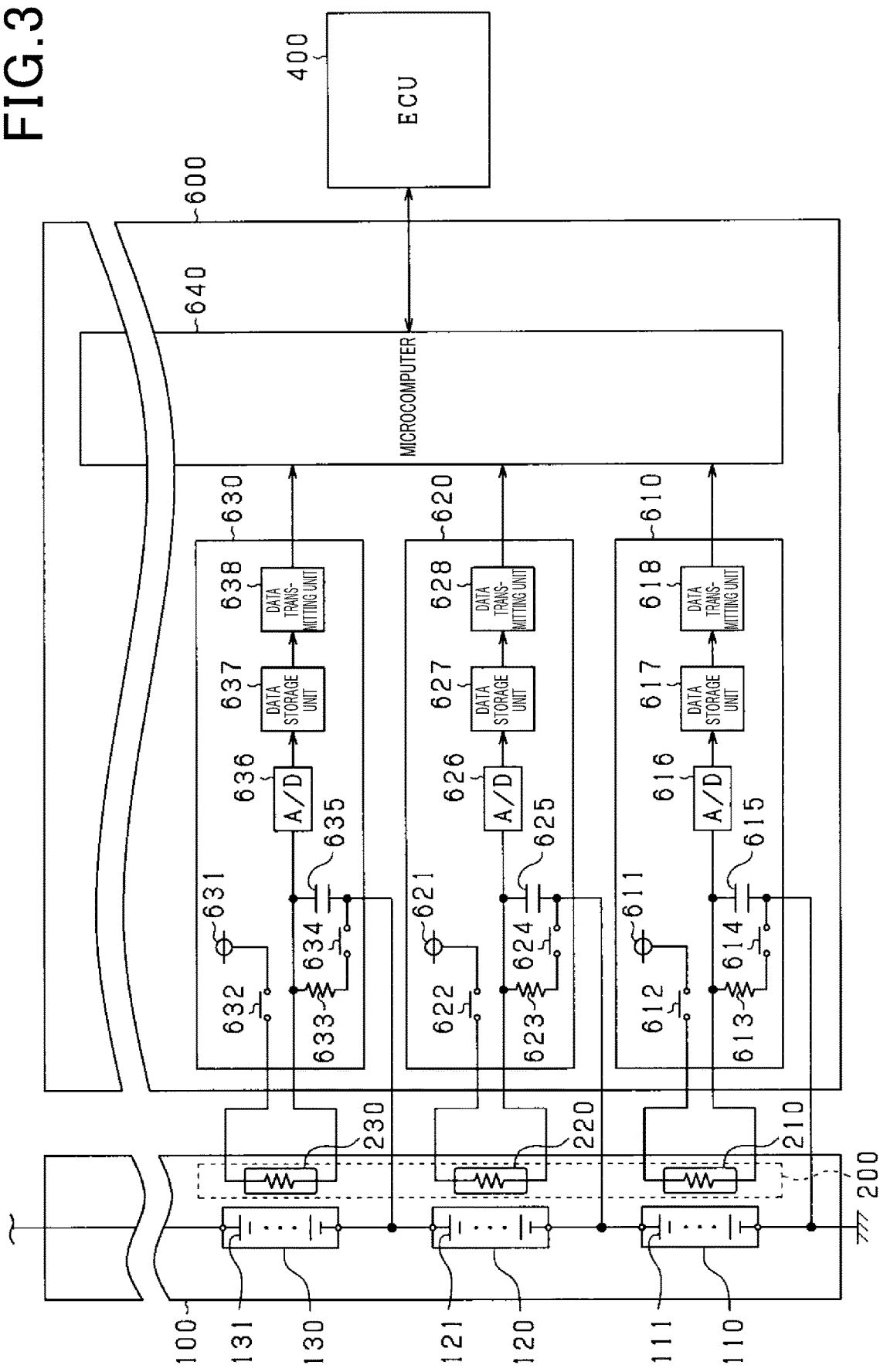
FIG. 3 is a diagram of a configuration of a battery monitoring apparatus according to a third embodiment.

According to the present embodiment, a part of the configuration of the battery monitoring apparatus differs from those according to the first and second embodiments. The battery monitoring apparatus according to the present embodiment will be described with reference to FIG. 3.

A battery control ECU 600 according to the present embodiment includes monitoring circuits 610, 620, and 630, and a microcomputer 640. The monitoring circuits 610, 620, and 630, and the microcomputer 640 are mounted on a common substrate.

The monitoring circuits 610, 620, and 630 are respectively configured to include constant-voltage power supplies 611, 621, and 631, series-connection bodies configured by pull-down resistors 613, 623, and 633 and second switches 614, 624, and 634, and capacitors 615, 625, and 635. The constant-voltage power supplies 611, 621, and 631 are connected to first ends of the thermistors 210, 220, and 230 via first switches 612, 622, and 632. The series-connection bodies, which are configured by the pull-down resistors 613, 623, and 633 and the second switches 614, 624, and 634, are connected to second ends of the thermistors 210, 220, and 230. The capacitors 615, 625, and 635 are connected in parallel to the series-connection bodies configured by the pull-down resistors 613, 623, and 633 and the second switches 614, 624, and 634. The sides of the pull-down resistors 613, 623, and 633 and the second switches 614, 624, and 634 opposite the sides connected to the thermistors 210, 220, and 230, and the sides of the capacitors 615, 625, and 635 opposite the sides connected to the thermistors 210, 220, and 230 are connected to the reference potential points.

Capacitor voltages Vc that are the voltages between the thermistors 210, 220, and 230, and the pull-down resistors 613, 623, and 633 and the capacitors 615, 625, and 635 are converted to digital values by A/D converting units 616, 626, and 636. Voltage data, which is the output values of the A/D converting units 616, 626, and 636, is inputted to data storage units 617, 627, and 637. The data storage units 617, 627, and 637 temporarily store therein the voltage data acquired from the A/D converting units 616, 626, and 636. The voltage data temporarily stored in the data storage unit 617, 627, and 637 is transmitted to the microcomputer 640 from data transmitting units 618, 628, and 638. The microcomputer 640 calculates the temperatures of the thermistors 210, 220, and 230 and makes a determination regarding a short circuit to the battery 100 based on the acquired voltage data.

Figure 4:
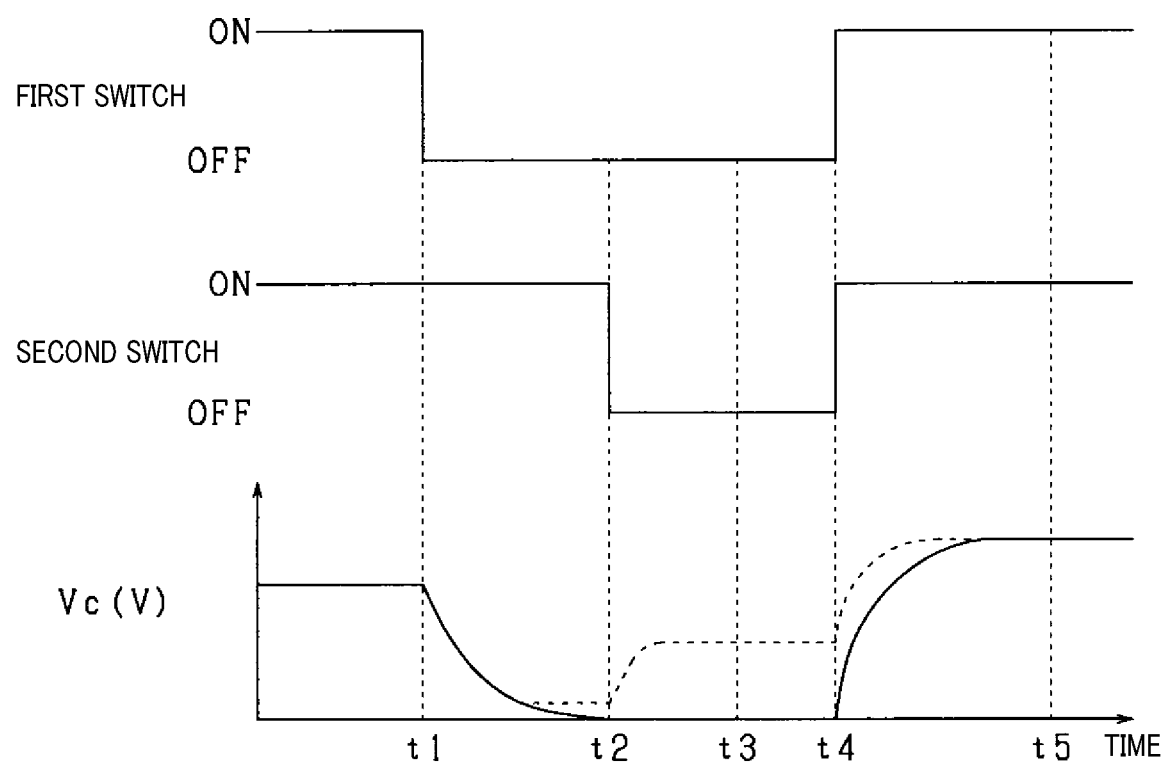
FIG. 4 is a time chart for explaining control according to the third embodiment.

Battery monitoring control performed by the battery monitoring apparatus, configured as described above, will be described with reference to FIG. 4. FIG. 4 shows control states of the first switches 612, 622, and 632 and the second switches 614, 624, and 634, and the capacitor voltage Vc. In FIG. 4, the capacitor voltage Vc when a short circuit has not occurred between the battery 100 and any of the thermistors 210, 220, and 230 is indicated by a solid line. The capacitor voltage Vc when a short circuit has occurred between the battery 100 and any of the thermistors 210, 220, and 230 is indicated by a broken line.

First, at time t1, the first switches 612, 622, and 632 are turned OFF. In this case, electric power is not supplied from the constant-voltage power supplies 611, 621, and 631 to the capacitors 615, 625, and 635. Therefore, the capacitor voltage Vc monotonically decrease. At time t2 after the elapse of a predetermined amount of time from time t1, the second switches 614, 624, and 634 are turned OFF. The time interval between time t1 and time t2 is set in advance based on capacitances of the capacitors 615, 625, and 635, and a time constant prescribed by the resistance values of the pull-down resistors 613, 623, and 633.

When the second switches 614, 624, and 634 are turned OFF, in cases in which a short circuit has not occurred between the battery 100 and any of the thermistors 210, 220, and 230, the capacitor voltage Vc is held at a value of zero. Meanwhile, in cases in which a short circuit has occurred between the battery 100 and any of the thermistors 210, 220, and 230, electric power is supplied from the battery 100 to the thermistor 210, 220, or 230. Therefore, the capacitor voltage Vc transition to an increasing state. At time t3 after the elapse of a predetermined amount of time from time t2, the determination regarding a short circuit is made based on the acquired capacitor voltage Vc.

At subsequent time t4, the first switches 612, 622, and 632, and the second switches 614, 624, and 634 are all turned ON. The time interval between time t3 and time t4 is merely required to be longer than the amount of time required for determination of a short circuit. When the first switches 612, 622, and 632 and the second switches 614, 624, and 634 are turned ON, the supply of electric power from the constant-voltage power supplies 611, 621, and 631 is resumed. Therefore, the capacitor voltage Vc also increases. At time t5 after the elapse of a predetermined amount of time from time t4, the temperatures of the thermistors 210, 220, and 230 are determined based on the values of the respective capacitor voltages Vc. The temperatures of the thermistors 210, 220, and 230 are preferably determined in a state in which the values of the capacitor voltages Vc are held at fixed values. Therefore, the time interval between time t4 and time t5 is set in advance based on the capacitances of the capacitors 615, 625, and 635, and a time constant prescribed by the resistance values of the pull-down resistors 613, 623, and 633.

As a result of the above-described configuration, the battery monitoring apparatus according to the present embodiment achieves the following effect in addition to the effects according to the first embodiment.

When a short circuit occurs between any of the thermistors 210, 220, and 230, and the battery 100, a resistance component may be present in the location of the short circuit. The voltage-drop amount caused by the thermistor 210, 220, or 230 and the resistance component increases as the resistance component increases. The value of the voltage inputted to the microcomputer 640 decreases.

According to the present embodiment, when a short circuit between the thermistors 210, 220, and 230 and the battery 100 is to be detected, the second switches 614, 624, and 634 are set to the disconnected state. The pull-down resistors 613, 623, and 633 are isolated. Therefore, when a short circuit occurs between any of the thermistors 210, 220, and 230 and the battery 100, the corresponding capacitor 615, 625, or 635 is charged. That is, a short circuit between the battery 100 and any of the thermistors 210, 220, and 230 can be detected as a result of the voltages of the capacitors 615, 625, and 635 being detected.

<Fourth Embodiment>

Figure 5:
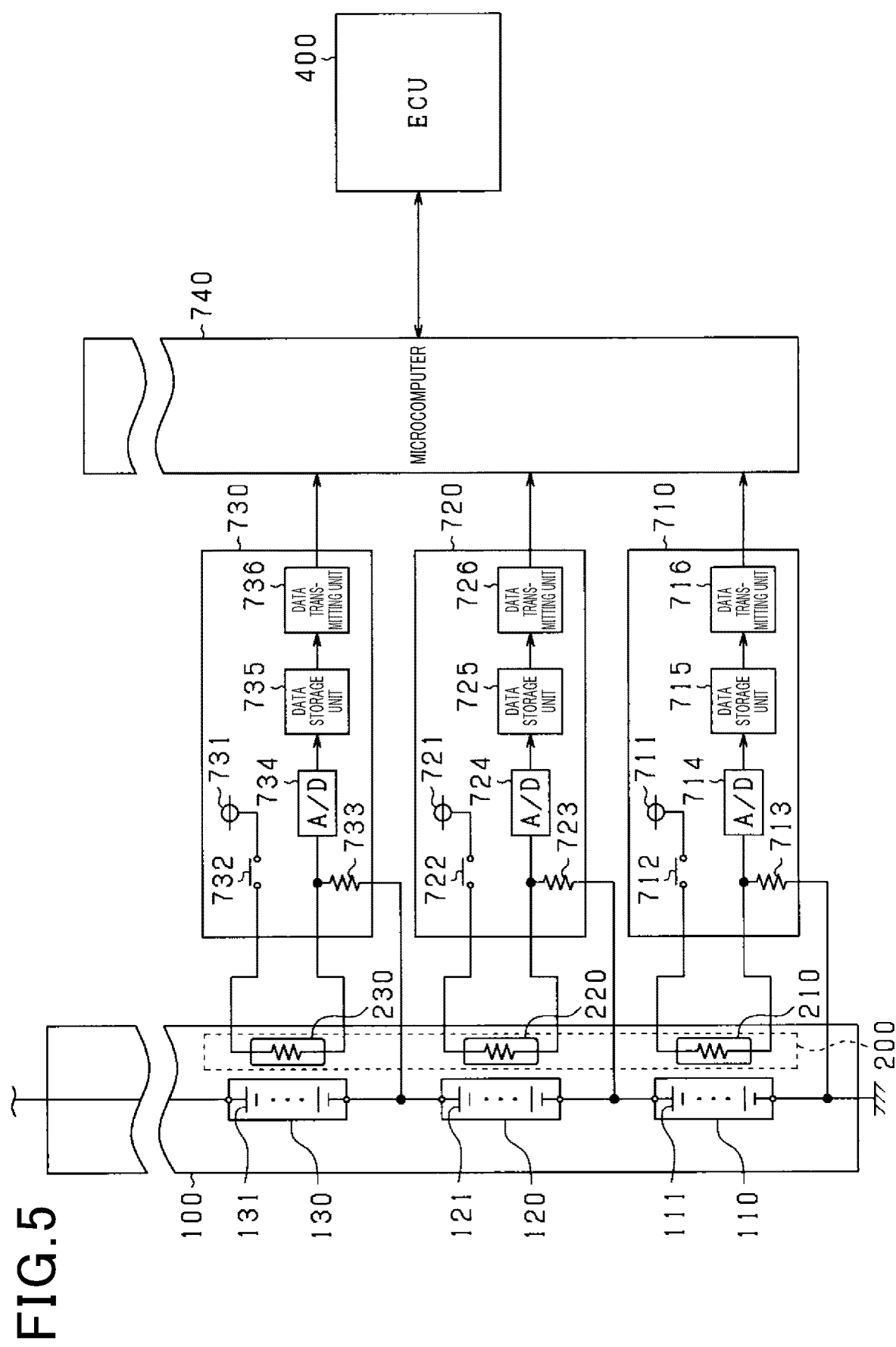
FIG. 5 is a diagram of a configuration of a battery monitoring apparatus according to a fourth embodiment.

As shown in FIG. 5, the overall configuration of the battery monitoring apparatus according to the present embodiment differs from those according to the first to third embodiments.

Monitoring circuits 710, 720, and 730 are mounted on differing substrates. The substrates are respectively attached to the stacks 110, 120, and 130 to be monitored. The monitoring circuits 710, 720, and 730 are communicably connected to a microcomputer 740 that is also mounted on a differing substrate. The microcomputer 740 is attached to a casing of the battery 100.

The monitoring circuits 710, 720, and 730 respectively include constant-voltage power supplies 711, 721, and 731, and pull-down resistors 713, 723, and 733. The constant-voltage power supplies 711, 721, and 731 are connected to first ends of the thermistors 210, 220, and 230 via first switches 712, 722, and 732. The pull-down resistors 713, 723, and 733 are connected to second ends of the thermistors 210, 220, and 230. The side of each of the pull-down resistors 713, 723, and 733 opposite the side connected to the corresponding thermistor 210, 220, or 230 is connected to the low-potential side of the corresponding stack 110, 120, or 130 of which the temperature is to be detected, as a reference potential point. Each of the constant-voltage power supplies 711, 721, and 731 is a power supply that outputs a constant voltage that is prescribed in advance. For example, the constant voltage is set such that a potential difference from the reference potential point is 5 volts. In an open state, the switches 712, 722, and 732 respectively function as the limiting units that limit the application of voltages from the constant-voltage power supplies 711, 721, and 731 to the thermistors 210, 220, and 230.

The monitoring circuits 710, 720, and 730 include A/D converting units 714, 724, and 734. The A/D converting units 714, 724, and 734 respectively convert the voltages between the thermistors 210, 220, and 230 and the pull-down resistors 713, 723, and 733 to digital values. Voltage data, which is the output values from the A/D converting units 714, 724, and 734, is inputted to data storage units 715, 725, and 735. The data storage units 715, 725, and 735 temporarily store therein the voltage data acquired from the A/D converting units 714, 724, and 734. The voltage data temporarily stored in the data storage units 715, 725, and 735 is transmitted to the microcomputer 740 from data transmitting units 716, 726, and 736. The microcomputer 740 calculates the temperatures of the thermistors 210, 220, and 230 and makes a determination regarding a short circuit to the battery 100, based on the acquired voltage data.

According to the present embodiment, the monitoring circuits 710, 720, and 730 that have configurations equivalent to those of the monitoring circuits 310, 320, and 330 according to the first embodiment are mounted on separate substrates. However, monitoring circuits that have configurations equivalent to those of the monitoring circuits 510, 520, and 530 according to the second embodiment or the monitoring circuits 610, 620, and 630 according to the third embodiment may be mounted on separate substrates, as well.

In addition, variable voltage sources may be provided instead of the constant-voltage power supplies 711, 721, and 731 and the switches 712, 722, and 732.

As a result of the above-described configuration, the battery monitoring apparatus according to the present embodiment achieves the effects according to the first embodiment.

<Variation Examples>

According to the embodiments, each of the stacks 110, 120, and 130 is provided with a single monitoring circuit. However, a plurality of monitoring circuits may be provided. In this case, regarding only the monitoring circuits that monitor a predetermined number of battery cells 111, 121, and 131 from the lowest-potential side of the stacks 110, 120, and 130, or more specifically, the single cells having a potential lower than the power supply voltage, a switch for switching the connection state to the constant-voltage power supply may be provided, or the power supply may be a variable voltage source. A reason for this is that, in cases in which a short circuit to a single cell on a high-voltage side occurs, the voltage inputted to the A/D converting unit reaches the upper limit value regardless of the voltage of the power supply. The determination regarding the short circuit can be made based on a condition that the digital value outputted from the A/D converting unit is the upper limit value.

According to the embodiments, the reference potential point of each monitoring circuit is on the low-potential side of the stack to be monitored by the monitoring circuit. However, the reference potential point may be on the low-potential side of the stack 110 having the lowest potential in the battery 100. In this case, regarding only the monitoring circuit that monitors the stack 110 having the lowest potential, a switch for switching the connection state to the constant-voltage power supply may be provided, or the power supply may be a variable voltage source. A reason for this is that, in cases in which a short circuit to a stack on the high-voltage side occurs, the voltage inputted to the A/D converting unit reaches the upper limit value regardless of the voltage of the power supply. The determination regarding the short circuit can be made based on a condition that the digital value outputted from the A/D converting unit is the upper limit value.

According to the embodiments, the battery is configured by the plurality of stacks 110, 120, and 130 that respectively include the plurality of battery cells 111, 121, and 131. In this regard, the stacks may not be provided. In this configuration, all that is required is that the voltage applied from the power supply to the thermistor provided for a single cell having a potential that is equal to or lower than the power supply voltage (5 volts) be variable.

The embodiments may be used in combination. For example, in the first embodiment, the switches 312, 322, and 333 may not be provided. The variable voltage source 511 may be used as according to the second embodiment.

According to the embodiments, the voltage data is transmitted to the microcomputer from the data transmitting unit of each monitoring circuit. However, not all of the monitoring circuits are required to be provided with the function for transmitting the voltage data to the microcomputer. A single or a plurality of monitoring circuits may be provided with the function for transmitting the voltage data to the microcomputer. The voltage data of the other monitoring circuits may be transmitted to the microcomputer via the monitoring circuit provided with the transmission function.

According to the embodiments, each thermistor is provided with the A/D converting unit, the data storage unit, and the data transmitting unit. However, a single A/D converting unit, a single data storage unit, and a single data transmitting unit may be provided for a plurality of thermistors, resistors, and the like. In this case, the voltage values to be detected may be inputted to the A/D converting unit via a multiplexer.

According to the embodiments, a short circuit to the battery 100 is detected based on the voltages between the thermistors 210, 220, and 230 and the reference potential points. However, the short circuit to the battery 100 may be detected based on the voltages between the power supplies and the thermistors 210, 220, and 230.

According to the embodiments, the thermistor is used as the temperature detecting unit. However, a temperature-sensitive diode of which voltage-current characteristics change in accompaniment with temperature change may be used.

What is claimed is:

1. A battery monitoring apparatus that monitors a temperature of a battery, the battery monitoring apparatus comprising:
   a temperature detecting unit that is provided for the battery and of which resistance changes with temperature;
   a power supply that is separate from the battery and applies a voltage to the temperature detecting unit;
   a limiting unit that limits the application of voltage to the temperature detecting unit from the power supply;
   a temperature acquiring unit that determines the temperature of the battery based on a voltage-drop amount in the temperature detecting unit when the limiting unit is not limiting the application of voltage; and
   a determining unit that makes a determination regarding a short circuit between the temperature detecting unit and the battery based on the voltage applied to the temperature detecting unit when the limiting unit is limiting the application of voltage.

2. The battery monitoring apparatus according to claim 1, wherein:
   the determining unit makes the determination regarding a short circuit based on a voltage between the temperature determining unit and a reference potential point.

3. The battery monitoring apparatus according to claim 2, further comprising:
   a pull-down resistor through which the temperature detecting unit is connected to the reference potential point,
   the determining unit being configured to make the determination regarding a short circuit based on a voltage between the temperature detecting unit and the pull-down resistor.

4. The battery monitoring apparatus according to claim 3, wherein:
   the battery is configured by a plurality of single cells that are connected in series; and
   the limiting unit is provided for only the temperature detecting unit that detects a temperature of a predetermined number of single cells from a low-potential side.

5. The battery monitoring apparatus according to claim 2, wherein:
   the determining unit is configured to:
   acquire a voltage between the power supply and the temperature detecting unit;
   compare the voltage between the power supply and the temperature detecting unit and the voltage between the temperature detecting unit and the reference potential point; and
   determine whether the short circuit has occurred on the power supply side or the reference potential point side of the temperature detecting unit.

6. The battery monitoring apparatus according to claim 5, further comprising:
   a pull-up resistor through which a first end of the temperature detecting unit is connected to the power supply; and
   a pull-down resistor through which a second end of the temperature detecting unit is connected to the reference potential point,
   the determining unit being configured to:
   acquire a first voltage and a second voltage, the first voltage being a voltage between the temperature detecting unit and the pull-up resistor, the second voltage being a voltage between the temperature detecting unit and the pull-down resistor;
   compare the first voltage and the second voltage; and determine whether the short circuit has occurred on the power supply side or the reference potential point side of the temperature detecting unit.

7. The battery monitoring apparatus according to claim 6, wherein:
the battery is configured by a plurality of single cells that are connected in series; and
the limiting unit is provided for only the temperature detecting unit that detects a temperature of a predetermined number of single cells from a low-potential side.

8. The battery monitoring apparatus according to claim 5, wherein:
the battery is configured by a plurality of single cells that are connected in series; and
the limiting unit is provided for only the temperature detecting unit that detects a temperature of a predetermined number of single cells from a low-potential side.

9. The battery monitoring apparatus according to claim 2, further comprising:
a capacitor that is connected to the temperature detecting unit in series, between the temperature detecting unit and the reference potential point; and
a series-connection body that is configured by a resistor and a switch, the series-connection body being connected to the capacitor in parallel,
the determining unit being configured to make the determination regarding a short circuit based on a voltage of the capacitor when the limiting unit is limiting the application of voltage and the switch is in an open state.

10. The battery monitoring apparatus according to claim 9, wherein:
the battery is configured by a plurality of single cells that are connected in series; and
the limiting unit is provided for only the temperature detecting unit that detects a temperature of a predetermined number of single cells from a low-potential side.

11. The battery monitoring apparatus according to claim 2, wherein:
the battery is configured by a plurality of single cells that are connected in series; and
the limiting unit is provided for only the temperature detecting unit that detects a temperature of a predetermined number of single cells from a low-potential side.

12. The battery monitoring apparatus according to claim 1, wherein:
the battery is configured by a plurality of single cells that are connected in series; and
the limiting unit is provided for only the temperature detecting unit that detects a temperature of a predetermined number of single cells from a low-potential side.

13. The battery monitoring apparatus according to claim 12, wherein:
the predetermined number is a number of single cells having a potential equal to or lower than a voltage of the power supply.

14. The battery monitoring apparatus according to claim 12, wherein:
the battery is configured by a plurality of stacks that are connected in series, each stack including a plurality of single cells; and
the limiting unit is provided for only the temperature detecting unit that detects a temperature of the stack on the lowest-potential side.

* * * * *